US006666368B2

(12) United States Patent
Rinne

(10) Patent No.: US 6,666,368 B2
(45) Date of Patent: Dec. 23, 2003

(54) METHODS AND SYSTEMS FOR POSITIONING SUBSTRATES USING SPRING FORCE OF PHASE-CHANGEABLE BUMPS THEREBETWEEN

(75) Inventor: Glenn A. Rinne, Apex, NC (US)

(73) Assignee: Unitive Electronics, Inc., Research Triangle Park, NC (US)

( * ) Notice: Subject to any disclaimer, the term of this patent is extended or adjusted under 35 U.S.C. 154(b) by 70 days.

(21) Appl. No.: 10/016,270

(22) Filed: Nov. 2, 2001

(65) Prior Publication Data

US 2002/0109000 A1 Aug. 15, 2002

Related U.S. Application Data

(60) Provisional application No. 60/246,900, filed on Nov. 10, 2000.

(51) Int. Cl.$^7$ ............................................... B23K 31/02
(52) U.S. Cl. ............................. 228/180.22; 228/234.1
(58) Field of Search ......................... 228/180.22, 234.1, 228/245, 246

(56) References Cited

U.S. PATENT DOCUMENTS

| 5,119,240 A | | 6/1992 | Marion et al. ............... 359/850 |
|---|---|---|---|
| 5,381,946 A | | 1/1995 | Koopman et al. ........... 228/254 |
| 5,878,942 A | * | 3/1999 | Kodama et al. ......... 228/180.22 |
| 5,892,179 A | | 4/1999 | Rinne et al. ................ 174/261 |
| 5,968,670 A | | 10/1999 | Brofman et al. ............ 428/576 |
| 5,992,729 A | * | 11/1999 | Koopman et al. ........... 228/175 |
| 6,037,192 A | * | 3/2000 | Witzman et al. ............ 438/118 |
| 6,117,299 A | | 9/2000 | Rinne et al. ................ 205/125 |
| 6,121,062 A | * | 9/2000 | Karasawa et al. ............. 438/15 |
| 6,131,795 A | * | 10/2000 | Sato ........................... 228/102 |
| 6,138,894 A | * | 10/2000 | Ulmer ..................... 228/111.5 |
| 6,495,397 B2 | * | 12/2002 | Kubota et al. ............... 438/108 |

FOREIGN PATENT DOCUMENTS

| JP | 02206138 | 8/1990 | ............ H01L/21/60 |
|---|---|---|---|
| JP | 05144874 | 6/1993 | ............ H01L/21/60 |
| JP | 11145197 | 5/1999 | ............ H01L/21/60 |

OTHER PUBLICATIONS

International Search Report for PCT/US01/43426; Date of Mailing—Mar. 25, 2003.

* cited by examiner

Primary Examiner—M. Alexandra Elve
Assistant Examiner—Len Tran
(74) Attorney, Agent, or Firm—Myers Bigel Sibley & Sajovec

(57) ABSTRACT

A second substrate is positioned relative to a first substrate having phase-changeable bumps, such as solder bumps, between them, wherein the second substrate has a first face adjacent the first substrate, a second face remote from the first substrate, and at least one edge wall between the first and second faces. The phase-changeable bumps are liquefied to establish an equilibrium position of the first and second substrates relative to one another. At least a portion of the second face is pushed away from the equilibrium position towards the first substrate, to a new position, without applying external force to the first face other than spring forces of the phase-changeable bumps that are liquefied, and without applying external force to any edge wall. Thus, only spring forces of the phase-changeable bumps that are liquefied oppose the pushing. The phase-changeable bumps that are liquefied then are solidified, to maintain the new position.

15 Claims, 4 Drawing Sheets

METHODS AND SYSTEMS FOR POSITIONING SUBSTRATES USING SPRING FORCE OF PHASE-CHANGEABLE BUMPS THEREBETWEEN

CROSS-REFERENCE TO PROVISIONAL APPLICATION

This application claims the benefit of Provisional Application Serial No. 60/246,900, filed Nov. 10, 2000, entitled *Hydrostatic Control of Die Height, Pitch and/or Roll*, the disclosure of which is hereby incorporated herein by reference in its entirety as if set forth fully herein.

FIELD OF THE INVENTION

This invention relates to micro-miniature packaging systems and methods, and more particularly to systems and methods for positioning substrates relative to one another.

BACKGROUND OF THE INVENTION

Solder bump technology is widely used for electrical and/or mechanical interconnection of substrates. As used herein, substrates can include microelectronic substrates such as integrated circuits and second- or third-level packaging substrates such as printed circuit boards; electro-optical substrates such as substrates including a light emitting diode or laser; optical substrates including a mirror or grating; and sensor substrates that include a sensor. For example, an integrated circuit chip, mirror or laser may be connected to a circuit board or other next level packaging substrate using solder bumps. This connection technology also is referred to as "controlled collapse chip connection-C4" or "flip-chip" technology, and will be referred to herein as solder bumps. Solder bump technology is described, for example, in U.S. Pat. Nos. 6,117,299, 5,892,179 and 5,381,946, the disclosures of which are hereby incorporated herein by reference in their entirety as if set forth fully herein, and need not be described further herein.

It also will be understood that solder bumps are an example of a phase-changeable bump that can be used to position a first substrate relative to a second substrate. Phase-changeable bumps can be controllably changed between liquid and solid phases. Other phase-changeable bump technologies include, for example, waxes, ultraviolet-curable epoxy, thermally-cured epoxy, chemically-cured epoxy, thermoplastics, thermoset plastic, electrorheologic fluids and magnetorheologic fluids. It will be understood that electrorheologic and magnetorheologic fluids are fluids that may contain small polar or ferromagnetic particles that can stick together when exposed to either an electrical or magnetic field, respectively. When the particles stick together, the viscosity of the fluid can increase dramatically. The design and operation of all of these phase-changeable bump technologies are well known to those having skill in the art, and need not be described further herein.

In many applications where a second substrate is positioned relative to a first substrate using phase-changeable bumps therebetween, it may be desirable to precisely control the separation distance, pitch and/or roll of the second substrate relative to the first substrate. For example, when the second substrate comprises an optoelectronic or optical element, such as a laser or mirror, it may be desirable to mount the laser or mirror on a second level package at a precise height, pitch and/or roll, in order to precisely define a desired optical path.

A desired height, pitch and/or roll may be obtained by liquefying the phase-changeable bumps and positioning the second substrate on a first substrate at the desired height, pitch and/or roll using a gripper or manipulator that generally is used to "pick and place" integrated circuits on mounting substrates. Unfortunately, however, these grippers or manipulators generally grip, grab or squeeze the second substrate on both faces thereof and/or against the edge wall thereof. Therefore, these grippers or manipulators may have a limited range of height, pitch and/or roll motion, and may also damage the first and/or second substrates during gripping and positioning.

SUMMARY OF THE INVENTION

Embodiments of the present invention position a second substrate relative to a first substrate having phase-changeable bumps therebetween, wherein the second substrate has a first face adjacent the first substrate, a second face remote from the first substrate, and at least one edge wall between the first and second faces. The phase-changeable bumps are liquefied to establish an equilibrium position of the first and second substrates relative to one another. At least a portion of the second face is pushed away from the equilibrium position towards the first substrate, to a new position, without applying external force to the first face other than spring forces of the phase-changeable bumps that are liquefied, and without applying external force to any edge wall. Thus, only the spring forces of the phase-changeable bumps that are liquefied oppose the pushing. The phase-changeable bumps that are liquefied then are solidified (i.e., set or hardened), to maintain the new position. In other embodiments, the functionality of the phase change and the spring force may be separated into different sets of bumps.

Embodiments of the invention may arise from recognition that the internal pressure of phase-changeable bumps that are liquefied can be used to create springs. External positioning may be performed by applying forces directed against the spring force, rather than grabbing with manipulators. External setting of height, pitch and/or roll thereby may be provided. After the desired position is achieved, the bumps can be solidified, for example by cooling and/or by chemical means.

In some embodiments of the invention, the second face is pushed away from the equilibrium position towards the first substrate at three spaced-apart points thereon, to define a plane that includes the new position, without applying external force to the first face other than spring forces of the phase-changeable bumps that are liquefied and without applying external force to any edge wall, such that only spring forces of the phase-changeable bumps that are liquefied oppose the pushing. In other embodiments, at least a portion of the second face is pushed away from the equilibrium position towards the first substrate to beyond the new position. Then, at least some of the pushing is released so that the spring forces of the phase-changeable bumps that are liquefied push the second face from beyond the new position to the new position, without applying external force to the first face other than spring forces of the phase-changeable bumps that are liquefied, and without applying external force to any edge wall.

In some embodiments, the equilibrium position places the first and second substrates parallel to one another, and the new position places the first and second substrates oblique to one another. Thus, pitch and/or roll may be adjusted. In other embodiments, the equilibrium position places the first and second substrates parallel to one another, and the new position places the first and second substrates parallel to one another, but closer to one another than the equilibrium position. Thus, height adjustment may be provided. Other combinations of height, pitch and/or roll also may be provided. Accordingly, precise control of height, pitch and/or roll may be obtained without the need to grab the underside or edge of the second substrate with manipulators.

DETAILED DESCRIPTION OF PREFERRED EMBODIMENTS

Figure 1A:
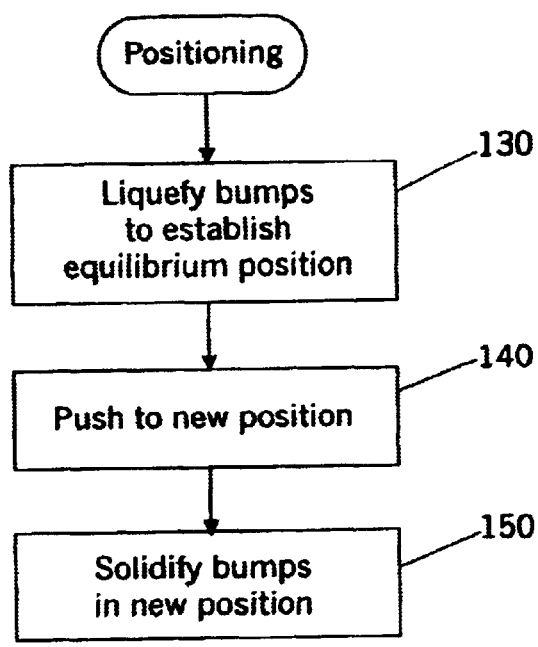
FIG. 1A is a flowchart of operations that can be used for positioning according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 1B:
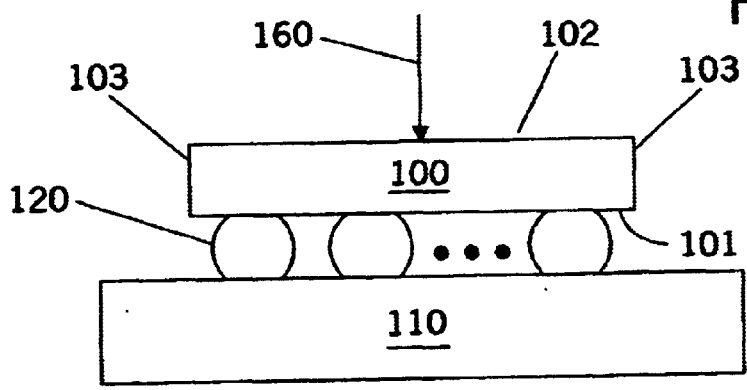
FIGS. 1B and 1C are cross-sectional views of substrates that can be positioned according to embodiments of the invention.

FIG. 1A is a flowchart of operations that can be used for positioning according to embodiments of the present invention. FIG. 1B is a cross-sectional view of substrates that can be positioned according to embodiments of the invention.

As shown in FIG. 1B, operations of FIG. 1A may be used to position a second substrate 100 relative to a first substrate 110 having phase-changeable bumps 120 therebetween. The second substrate 100 includes a first face 101 adjacent the first substrate 110, a second face 102 remote from the first substrate 110, and at least one edge wall 103 between the first and second faces 101 and 102, respectively. It will be understood that the first substrate 110 can be a microelectronic, electro-optical, optical, sensor and/or other substrate, and the second substrate 100 also can be a microelectronic, electro-optical, optical, sensor and/or other substrate. In some embodiments, the first substrate 110 comprises a printed circuit board, interposer, ceramic substrate or other second level package, and the second substrate 100 comprises an optoelectronic device such as a laser or light emitting diode, an integrated circuit including an optoelectronic device, an optical device such as a mirror or diffraction grating, an integrated circuit including an optical device and/or other substrate. The phase-changeable bumps 120 can include solder bumps and/or any of the other bump technologies described above and may be placed between the first and second substrates 110 and 100 using any conventional configuration. The bumps 120 may all be the same size, or may be of unequal sizes, and may be equally or unequally spaced apart. The bumps 120 initially may be placed or formed on the first substrate 110, the second substrate 100 or both.

Referring again to FIG. 1A, at Block 130, the phase-changeable bumps 120 are liquefied to establish an equilibrium position of the first and second substrates 110 and 100 relative to one another. It will be understood that liquefying need not be performed immediately before performing the pushing of Block 140. In fact, in many technologies, the bumps may be formed in a liquid state. Thus, the liquefying of Block 130 applies to initial formation of the bumps 120 in a liquid phase, as well as converting the bumps from a solid phase to a liquid phase. Moreover, the equilibrium position need not be maintained for a prolonged period of time, such that the pushing of Block 140 may be performed immediately upon liquefying of the bumps.

Referring now to Block 140, at least a portion of the second face 102 is pushed away from the equilibrium position towards the first substrate 110 in a direction generally shown by arrow 160, to a new position. This pushing is accomplished without applying external force to the first face 101, other than spring forces of the phase-changeable bumps 120 that are liquefied. This pushing also is accomplished without applying external force to any edge wall 103. Thus, only the spring forces of the phase-changeable bumps that are liquefied oppose the pushing.

Finally, at Block 150, the bumps are solidified to maintain the new position. It will be understood that the liquefying and solidifying at Blocks 130 and 150, respectively, may be performed using various techniques that may depend upon the bump technology that is employed. For example, when solder bumps are employed, heating can liquefy the bumps, and cessation of heating and/or active cooling can solidify the bumps. In another example, when ultraviolet-curable epoxy bumps are employed, ultraviolet radiation curing can solidify the bumps.

Additional qualitative and quantitative considerations for embodiments of the invention as described in FIGS. 1A and 1B now will be described. For electronic, optical and/or sensor components, it often is desirable to provide accurate positioning during assembly. Thus, it is common to mechanically grab, grip or squeeze the component to gain a mechanical advantage to position the component with three axes of motion. An example might be the mounting of a mirror on a substrate, and positioning the mirror to reflect a beam of light in a specific direction.

With flip-chip solder bump technology, the positioning in the plane of the substrate often may be adequate, since the solder bumps and their associated pads can be defined by photolithography. However, the height of the component above the substrate and the pitch and roll of the substrate may be less precise.

Embodiments of the invention can arise from recognition that the surface tension ($\gamma$) of solder can be quite high (about 450 dyne/cm) compared to water (about 72 dyne/cm). Thus, significant internal pressure can develop, particularly in small radius droplets that are generally used in micro-assemblies. According to the Young-Laplace equation:

$$P = \gamma \cdot \frac{2}{r}.$$

Thus, the internal pressure P of a solder bump is equal to the surface tension γ times 2 over the radius of curvature r of the solder bump. See, for example, Adamson, *Physical Chemistry of Surfaces*, Intersciences Publishers, Inc., New York, 1960, p. 6, the disclosure of which is hereby incorporated herein in its entirety by reference as if set forth fully herein.

For a 0.125 mm diameter eutectic lead-tin solder bump, the pressure pushing against a 0.125 mm pad can be about 42 milligrams-force. On a 1 $cm^2$ component, using 0.125 mm pitch perimeter bump arrangements, the total force on the component therefore can be 6.7 grams-force. Since the weight of a 0.5 mm thick silicon component this size may only be 117 milligrams-force, the pressure of the solder can exceed, and often far exceed, the weight of the component. Thus, if an external force attempts to move the component away from the equilibrium position, a force on the order of 6.7 grams-force may be needed. The bumps therefore act like springs, attempting to restore the position of the component.

Embodiments of the invention can push at least a portion of the second face 102 away from the equilibrium position towards the first substrate 110 to a new position, without applying external force to the first face 101, other than spring forces of the liquid bumps, and without applying external force to any edge wall 103, such that only spring forces of the liquid bumps oppose the pushing. Grippers, grabbers or manipulators that grab the second substrate 100 at the edge wall 103 and/or the first face 101 need not be used. These grippers or manipulators may be difficult to manipulate into position, may have a limited range of motion, and/or can impart damage to the first and/or second substrates 110 and 100, respectively.

Figure 1C:
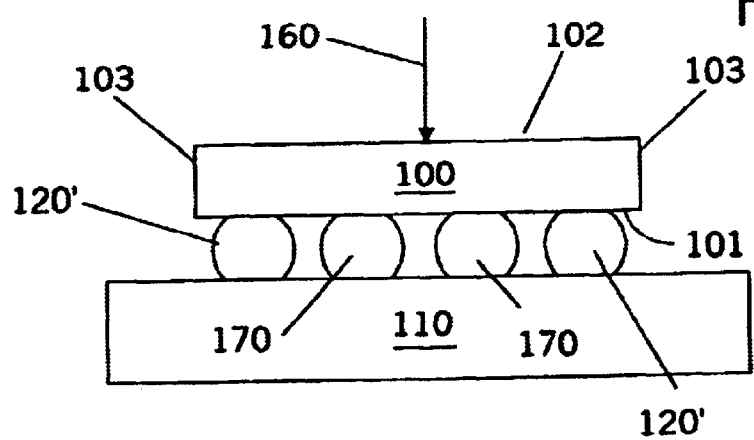

In embodiments of the invention that were described above in connection with FIGS. 1A and 1B, the phase-changeable bumps 120 also supply the spring force. However, in other embodiments of the invention, the spring force may, in whole or in part, be provided by separate bumps from the phase-changeable bumps. Thus, for example, referring to FIG. 1C, phase-changeable bumps 120' provide the phase change that solidifies the bumps in the new position (Block 150 of FIG. 1A). Spring force bumps 170 provide the spring force to establish the equilibrium position (Block 130 of FIG. 1A) and during pushing to a new position (Block 140 of FIG. 1A), without undergoing a phase change. However, it will be understood that the phase-changeable bumps 120' generally also will provide some spring force, whereas the spring force bumps 170 may not undergo a phase change. In one example, a set of bumps of a high surface tension material may act as spring force bumps 170, whereas ultraviolet-cured epoxy bumps may act as phase-changeable bumps 120, to fix the position. It also will be understood that in other embodiments of the invention in FIGS. 2–8 below, the functionality of spring force and phase change may be separated, in whole or in part, into two or more different sets of bumps, as was described in connection with FIG. 1C.

Figure 2:
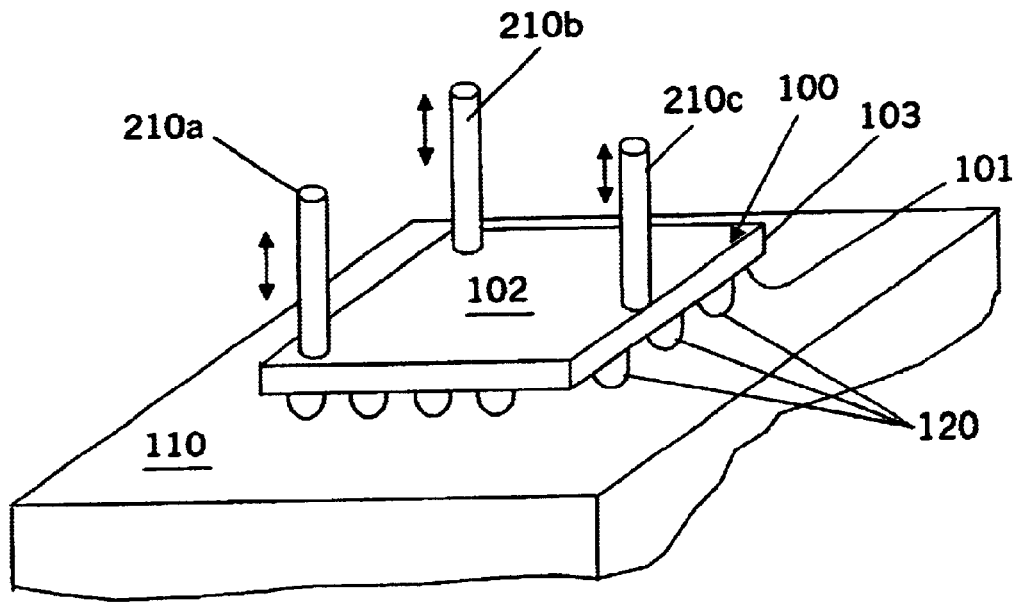
FIGS. 2 and 3 are perspective views of systems and methods for pushing according to embodiments of the invention.

FIG. 2 is a perspective view of systems and methods for pushing (Block 140 of FIG. 1A) according to some embodiments of the invention. As shown in FIG. 2, the second face 102 of the second substrate 100 is pushed away from the equilibrium position towards the first substrate 110 at three spaced apart points thereon, for example by using three actuatable pushing elements such as actuatable rods 210a, 210b and 210c, to define a plane that includes the new position, without applying external force to the first face 101, other than the spring forces of the bumps 120, and without applying external force to any edge wall 103. Thus, the three rods 210–210c can press the top of a component with a force of a few grams to effect a change of angle and/or distance, and define a plane of alignment. If the equilibrium position always is further from the first substrate 110 than desired, the height can be adjusted by pressing or pushing until all the bumps deform to the right height. Oversize bumps 120 may be used so that the equilibrium position is further away from the first substrate than desired. As will be shown below, the actuatable rods may be controlled by a controller, to provide the desired height, pitch and/or roll pushing.

Figure 3:
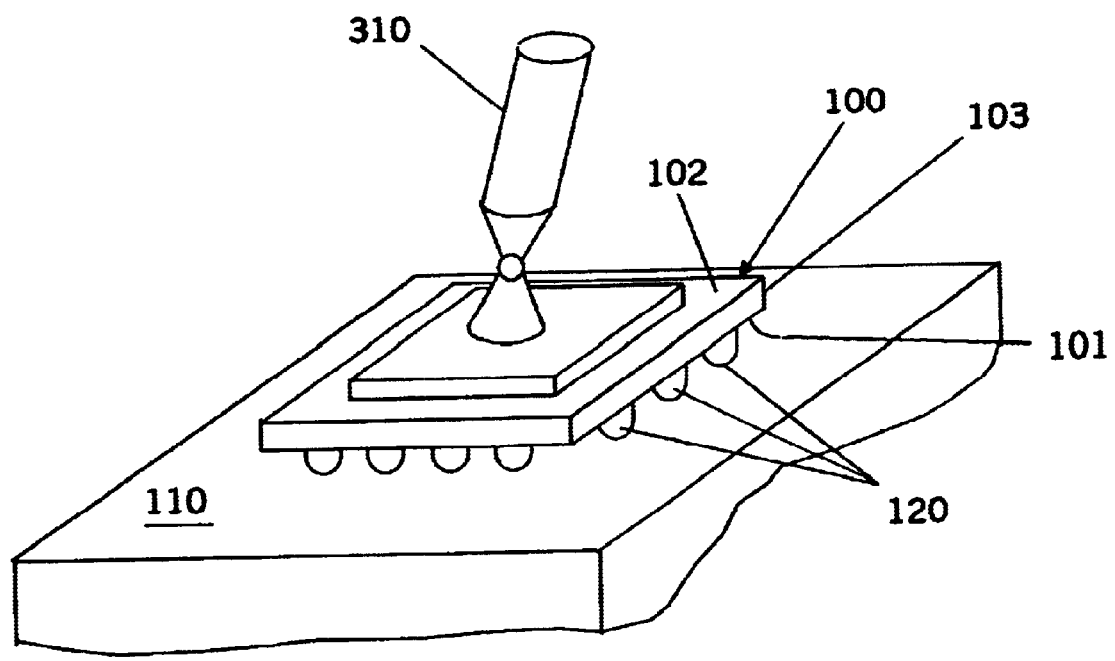

FIG. 3 illustrates yet other embodiments, wherein a manipulator 310 having three degrees of freedom, may be placed against the second face 102, to provide height, pitch and/or roll adjustment. However, the manipulator 310 need not grip the first face 101 or the edge wall 103, so that a wide range of motion may be obtained without imparting damage.

FIGS. 4A–6C are cross-sectional views illustrating various examples of pushing (Block 140 of FIG. 1A) according to embodiments of the invention. Pushing systems may be provided using embodiments of FIG. 2, FIG. 3 and/or other conventional actuating systems.

Figure 4A:
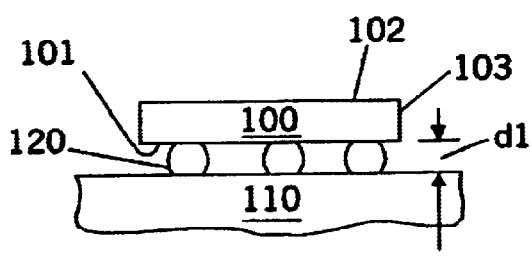
FIGS. 4A–4B, 5A–5B and 6A–6C are cross-sectional views illustrating various examples of pushing according to embodiments of the invention.
Figure 4B:
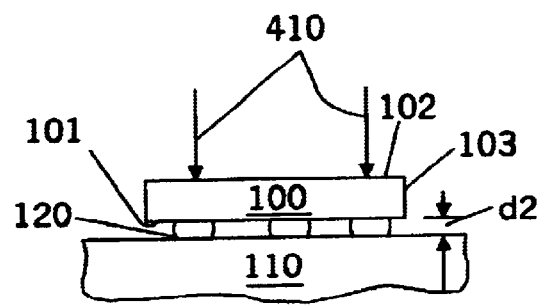

In FIG. 4A, the first and second substrates 110 and 100, respectively, are shown in an equilibrium position, parallel to one another and spaced apart from one another by a distance d1. In FIG. 4B, a uniform pushing force 410 is applied using one or more rods of FIG. 2, a micromanipulator of FIG. 3 and/or other pushing technique, to push the second substrate 100 towards the first substrate 110, while maintaining the first and second substrates parallel to one another. Thus, the separation distance is reduced from d1 to d2. Accordingly, these embodiments can change the height without changing pitch or roll.

Figure 5A:
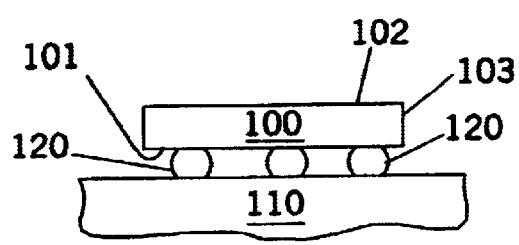
Figure 5B:
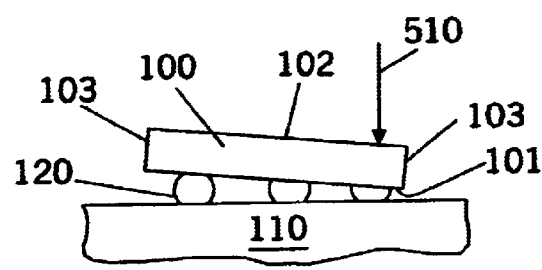

FIG. 5A again illustrates the first and second substrates 110 and 100 in an equilibrium position, similar to FIG. 4B. In FIG. 5B, a pushing force 510 may be applied at one or more off-center points of the second substrate 100, to thereby move the second substrate 100 oblique to the first substrate 110. It will be understood that embodiments of FIG. 5B may cause some of the solder bumps 120 to flatten relative to their equilibrium position, while other solder bumps 120 may elongate relative to their equilibrium position. Thus, both expansion and contraction of the spring force is being used.

Figure 6A:
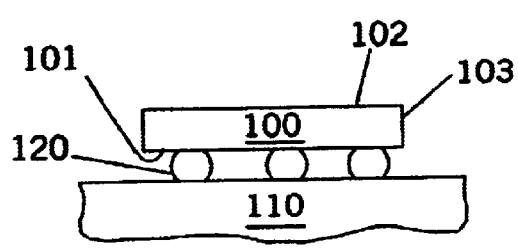
Figure 6B:
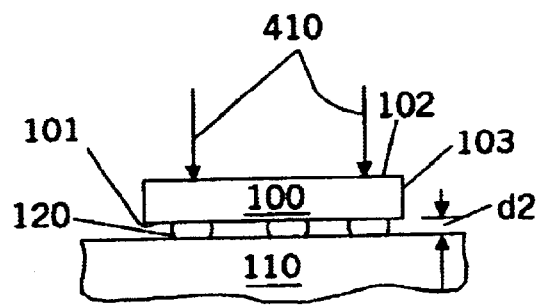
Figure 6C:
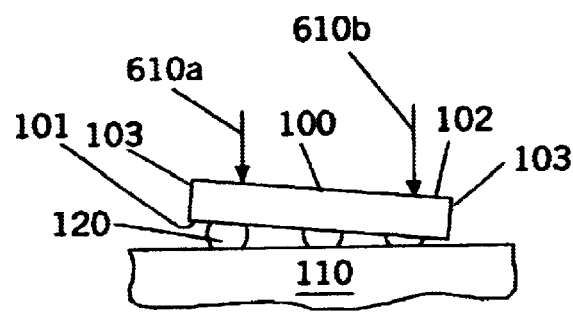

Embodiments of FIGS. 6A–6C can maintain an oblique position by flattening all of the bumps to a greater or lesser degree. Thus, referring to FIG. 6A, an equilibrium position similar to FIG. 4A is established. In FIG. 6B, the second substrate 100 is moved closer to the first substrate 110 to beyond the desired new position. In FIG. 6B, the second substrate 100 is moved to beyond the new position by application of a uniform pushing force 410, but without applying external force to the first face 101 other than spring forces of the bumps 120 and without applying external force to any edge wall 103, such that only spring forces of the bumps 120 oppose the pushing. It also will be understood that nonuniform pushing forces may be used to push only a portion of the second face beyond the new position.

Then, as shown in FIG. 6C, at least some of the pushing is retracted, so that the spring forces of the bumps push the second face 102 from beyond the new position to the new position without applying external force to the first face 101 other than the spring forces of the bumps 120 and without applying external force to any edge wall 103.

Thus, for example, as shown in FIG. 6C, the pushing force 610a at a first portion of the second substrate 100 is retracted more than the pushing force 610b at a second portion of the second substrate. Accordingly, by pushing the second substrate 100 towards the first substrate 110 to beyond the new position, and then releasing at least some of the pushing so that the spring forces of the bumps push the substrate from beyond the new position to the new position, precise positioning may be obtained. Stated differently, all of the bumps 120 in these embodiments remain flattened to a greater or lesser degree.

Figure 7:
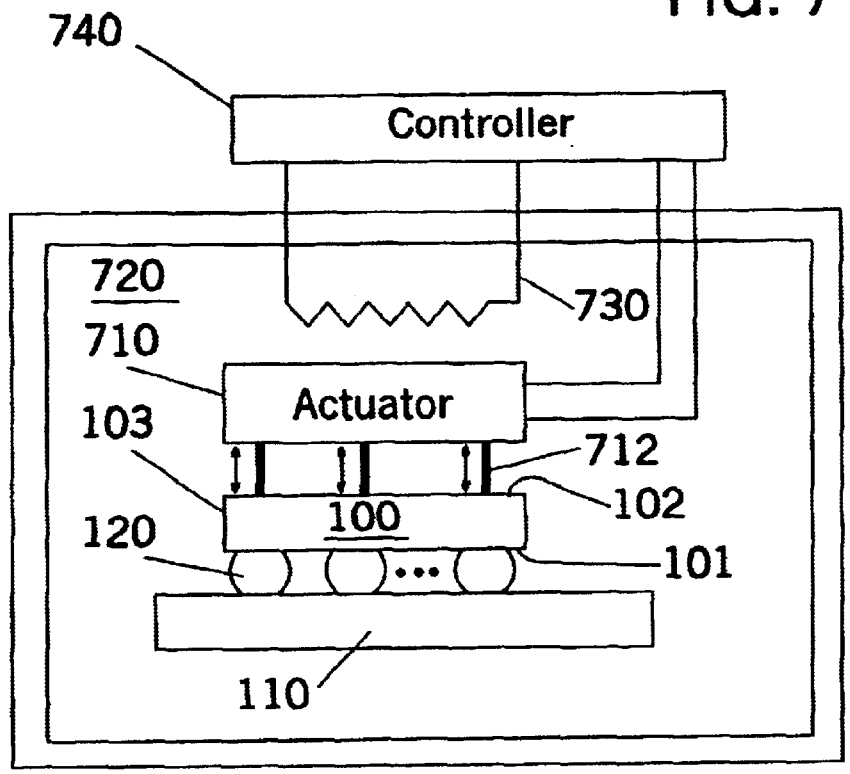
FIGS. 7 and 8 are schematic diagrams of systems for positioning a second substrate relative to a first substrate according to embodiments of the present invention.
Figure 8:
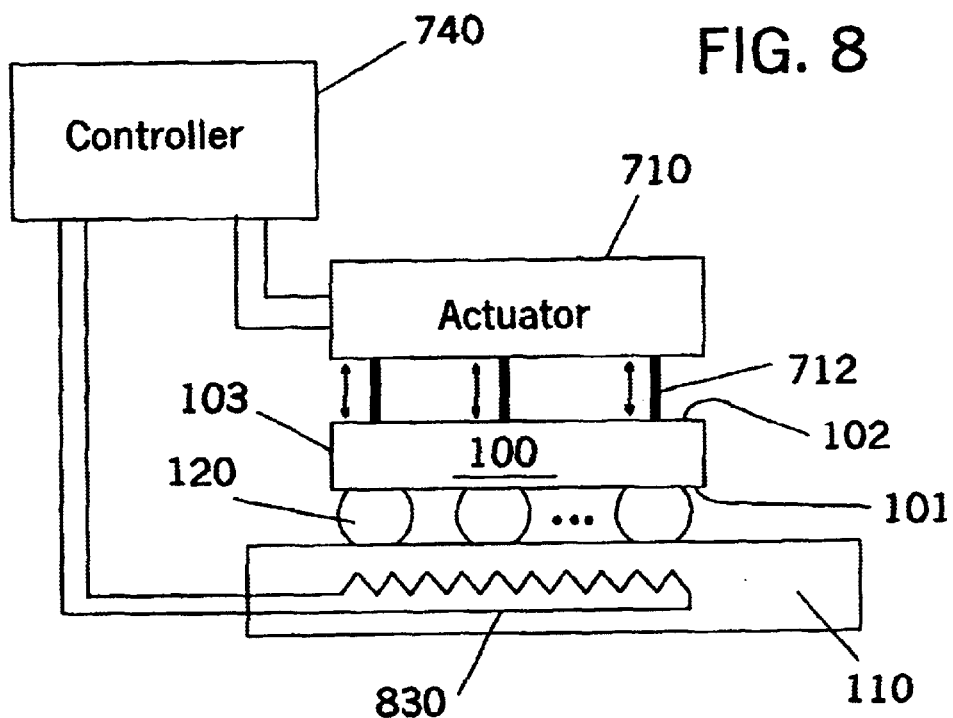

FIGS. 7 and 8 are block diagrams of systems for positioning a second substrate 100 relative to a first substrate 110 having bumps 120 therebetween according to embodiments of the present invention. In FIG. 7, an actuator system 710, including one or more actuatable elements 712 can provide pushing according to any of the above-described embodiments, and therefore can provide embodiments of means for pushing at least a portion of the second face 102 away from the equilibrium position towards the first substrate 110 to a new position, without applying external force to the first face 101 other than spring forces of the bumps 120, and without applying external force to any edge wall 103, such that only spring forces of the bumps 120 oppose the pushing. It will be understood that other actuator systems may be provided that can provide height, pitch and/or roll pushing.

Still referring to FIG. 7, the first and second substrates 110 and 100, respectively, the bumps 120 and the actuator 710 are contained within an ambient 720. When the phase-changeable bumps 120 comprise solder bumps, they may be liquefied by at least one heater 730 that heats the ambient 720. When other phase-changeable bumps are used, a radiation source, chemical source and/or other mechanism may be provided instead of or in addition to the heater 730, to liquefy the phase-changeable bumps. The heater 730 may be deactivated, and/or active cooling may be used, to solidify the solder bumps. As described above, when other phase-changeable bumps are used, other means for solidifying may be used. A controller 740 may be used to activate and deactivate the heater 730, and to move the elements 712 of the actuator 710 to provide liquefying, pushing and solidifying operations 130, 140 and 150, respectively, of FIG. 1A. It will be understood that the controller may be embodied using hardware, software and/or combinations thereof, and that one or more controllers may be used.

FIG. 8 schematically illustrates other embodiments wherein the bumps 120 comprise solder bumps and wherein at least one heater 830 may be provided in or on the first substrate 110 adjacent the solder bumps 120. At least one heater also may be provided in the second substrate 100 instead of, or in addition to, the at least one heater 830 in the first substrate. Ambient heating of FIG. 7 also may be employed. When phase-changeable bumps other than solder bumps are employed, other liquefying/solidifying means may be provided.

In conclusion, embodiments of the invention can reduce or eliminate the need for the grippers or clamps that generally are used for pick and place operations. These grippers may be difficult to manipulate or to position, can limit the range of motion and/or can impart damage to the substrate(s).

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of positioning a second substrate relative to a first substrate having phase-changeable bumps therebetween, the second substrate having a first face adjacent the first substrate, a second face remote from the first substrate and at least one edge wall between the first and second faces, the method comprising:

liquefying the phase-changeable bumps to establish an equilibrium position of the first and second substrates parallel to one another;

pushing at least a portion of the second face away from the equilibrium position towards the first substrate to a new position that places the first and second substrates oblique to one another, without applying external force to the first face other than spring forces of the phase-changeable bumps that are liquefied and without applying external force to any edge wall, such that only spring forces of the phase-changeable bumps that are liquefied oppose the pushing; and solidifying the phase-changeable bumps that are liquefied to maintain the new position.

2. A method according to claim 1 wherein the pushing comprises pushing the second face away from the equilibrium position towards the first substrate at three spaced apart points thereon to define a plane that includes the new position without applying external force to the first face other than spring forces of the phase-changeable bumps that are liquefied and without applying external force to any edge wall such that only spring forces of the phase-changeable bumps that are liquefied oppose the pushing.

3. A method according to claim 1 wherein the pushing comprises:

pushing at least a portion of the second face away from the equilibrium position towards the first substrate to beyond the new position without applying external force to the first face other than spring forces of the phase-changeable bumps that are liquefied and without applying external force to any edge wall such that only spring forces of the phase-changeable bumps that are liquefied oppose the pushing; and releasing at least some of the pushing so that the spring forces of the phase-changeable bumps that are liquefied push the second face from beyond the new position to the new position without applying external force to the first face other than spring forces of the phase-changeable bumps that are liquefied and without applying external force to any edge wall.

4. A method according to claim 1:

wherein the liquefying comprises heating the first and second substrates and the phase-changeable bumps to above a melting point of the phase-changeable bumps; and wherein the solidifying comprises allowing the first and second substrates and the phase-changeable bumps to cool to below the melting point of the phase-changeable bumps.

5. A method according to claim 1:

wherein at least one of the first and second substrates comprises at least one heater adjacent the phase-changeable bumps;

wherein the liquefying comprises activating the at least one heater to melt the phase-changeable bumps; and wherein the solidifying comprises deactivating the at least one heater to allow the phase-changeable bumps to solidify.

6. A method according to claim 1 wherein the first substrate comprises a microelectronic substrate and wherein the second substrate comprises an optical element.

7. A method according to claim 2 wherein the pushing comprises pushing the second face away from the equilibrium position towards the first substrate using at least three pushing elements that are located adjacent at three spaced apart points on the second face to define a plane that includes the new position without applying external force to the first face other than spring forces of the phase-changeable bumps that are liquefied and without applying external force to any edge wall such that only spring forces of the phase-changeable bumps that are liquefied oppose the pushing.

8. A method according to claim 1 wherein the phase-changeable bumps comprise solder bumps.

9. A method of positioning a second substrate relative to a first substrate having phase-changeable bumps and spring force bumps therebetween, the second substrate having a first face adjacent the first substrate, a second face remote from the first substrate and at least one edge wall between the first and second faces, the method comprising:

liquefying the phase-changeable bumps to allow the spring force bumps and the phase-changeable bumps to establish an equilibrium position of the first end second substrates parallel to one another;

pushing at least a portion of the second face away from the equilibrium position towards the first substrate to a new position that places the first and second substrates oblique to one another, without applying external force to the first face other than spring forces of the phase-changeable bumps that are liquefied and of the spring force bumps and without applying external force to any edge wall, such that only spring forces of the phase-changeable bumps that are liquefied and of the spring force bumps oppose the pushing; and solidifying the phase-changeable bumps that are liquified to maintain the new position.

10. A method according to claim 9 wherein the pushing comprises pushing the second face away from the equilibrium position towards the first substrate at three spaced apart points thereon to define a plane that includes the new position without applying external force to the first face other than spring forces of the phase-changeable bumps that are liquefied and of the spring force bumps and without applying external force to any edge wall such that only spring forces of the phase-changeable bumps that are liquefied and of the spring force bumps oppose the pushing.

11. A method according to claim 9 wherein the pushing comprises:

pushing at least a portion of the second face away from the equilibrium position towards the first substrate to beyond the new position without applying external force to the first face other than spring forces of the phase-changeable bumps that are liquefied and of the spring force bumps and without applying external force to any edge wall such that only spring forces of the phase-changeable bumps that are liquefied and of the spring force bumps oppose the pushing; and releasing at least some of the pushing so that the spring forces of the phase-changeable bumps that are liquefied and of the spring force bumps push the second face from beyond the new position to the new position without applying external force to the first face other than spring forces of the phase-changeable bumps that are liquefied and of the spring force bumps and without applying external force to any edge wall.

12. A method according to claim 9:

wherein the liquefying comprises heating the first and second substrates and the phase-changeable bumps to above a melting point of the phase-changeable bumps; and wherein the solidifying comprises allowing the first and second substrates and the phase-changeable bumps to cool to below the melting point of the phase-changeable bumps.

13. A method according to claim 9:

wherein at least one of the first and second substrates comprises at least one heater adjacent the phase-changeable bumps;

wherein the liquefying comprises activating the at least one heater to melt the phase-changeable bumps; and wherein the solidifying comprises deactivating the at least one heater to allow the phase-changeable bumps to solidify.

14. A method according to claim 9 wherein the first substrate comprises a microelectronic substrate and wherein the second substrate comprises an optical element.

15. A method according to claim 10 wherein the pushing comprises pushing the second face away from the equilibrium position towards the first substrate using at least three pushing elements that are located adjacent at three spaced apart points on the second face to define a plane that includes the new position without applying external force to the first face other than spring forces of the phase-changeable bumps that are liquefied and of the spring force bumps and without applying external force to any edge wall such that only spring forces of the phase-changeable bumps that are liquefied and of the spring force bumps oppose the pushing.

* * * * *